United States Patent
Klages et al.

(10) Patent No.: US 8,904,956 B2
(45) Date of Patent: Dec. 9, 2014

(54) PLASMA STAMP, PLASMA TREATMENT DEVICE, METHOD FOR PLASMA TREATMENT AND METHOD FOR PRODUCING A PLASMA STAMP

(75) Inventors: Claus-Peter Klages, Braunschweig (DE); Michael Thomas, Lehrte (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 786 days.

(21) Appl. No.: 12/992,121

(22) PCT Filed: May 20, 2009

(86) PCT No.: PCT/EP2009/003615
§ 371 (c)(1),
(2), (4) Date: Feb. 24, 2011

(87) PCT Pub. No.: WO2009/141143
PCT Pub. Date: Nov. 26, 2009

(65) Prior Publication Data
US 2011/0147345 A1    Jun. 23, 2011

(30) Foreign Application Priority Data

May 21, 2008    (DE) .......................... 10 2008 024 486

(51) Int. Cl.
| | | |
|---|---|---|
| *C23C 16/50* | (2006.01) | |
| *H01J 37/32* | (2006.01) | |
| *B05D 7/24* | (2006.01) | |
| *B29C 59/14* | (2006.01) | |
| *H01L 21/3065* | (2006.01) | |
| *C23C 16/455* | (2006.01) | |
| *C23C 16/40* | (2006.01) | |
| *C23C 16/505* | (2006.01) | |
| *B05D 3/14* | (2006.01) | |

(52) U.S. Cl.
CPC .......... *H01J 37/32532* (2013.01); *B05D 3/141* (2013.01); *C23C 16/45568* (2013.01); *C23C 16/402* (2013.01); *H01J 37/32009* (2013.01); *H01J 37/32366* (2013.01); *C23C 16/505* (2013.01); *B29C 59/14* (2013.01); *C23C 16/45559* (2013.01)
USPC .............. 118/723 E; 118/723 R; 156/345.43; 156/345.47

(58) Field of Classification Search
None
See application file for complete search history.

(56) References Cited

U.S. PATENT DOCUMENTS 5,380,396 A  *  1/1995  Shikida et al. ................... 216/2
6,333,601 B1 * 12/2001  Wickramanayaka .. 118/723 MR
(Continued)

FOREIGN PATENT DOCUMENTS

| DE | 100 56 564 A1 | 9/2001 |
|---|---|---|
| DE | 103 22 696 B3 | 1/2005 |

(Continued)

OTHER PUBLICATIONS

Penache et al. "Plasma printing: patterned surface functionalisation and coating at atmospheric pressure", IEE Proc.-Nanobiotechnol. vol. 151, No. 4, Aug. 2004, pp. 139-144.*

(Continued)

*Primary Examiner* — Jeffrie R Lund
*Assistant Examiner* — Stanislav Antolin
(74) *Attorney, Agent, or Firm* — Schwegman Lundberg & Woessner, P.A.

(57) ABSTRACT

The invention relates to a plasma stamp, with which surfaces can be subjected to a plasma treatment. In addition, the invention relates to a plasma treatment device, with which surfaces can be subjected to a plasma treatment, and also a plasma treatment method. In addition, the invention relates to a method for producing a plasma stamp.

19 Claims, 1 Drawing Sheet

(56) References Cited

U.S. PATENT DOCUMENTS

Figure 1:
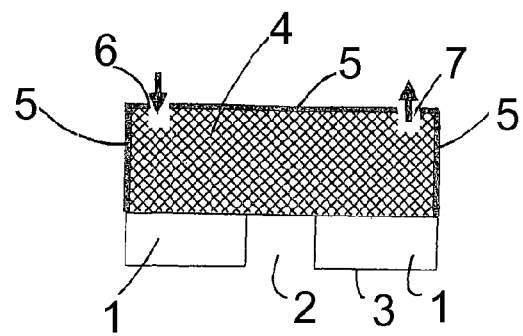

| | | | |
|---|---|---|---|
| 6,827,870 B1* | 12/2004 | Gianchandani et al. | 216/71 |
| 7,067,405 B2* | 6/2006 | Mikhael et al. | 438/503 |
| 2004/0208804 A1* | 10/2004 | Hall et al. | 422/186.04 |
| 2006/0234111 A1* | 10/2006 | Gulla et al. | 429/44 |
| 2007/0017636 A1* | 1/2007 | Goto et al. | 156/345.34 |
| 2007/0037408 A1* | 2/2007 | Tachibana et al. | 118/715 |
| 2007/0131354 A1* | 6/2007 | Yokogawa et al. | 156/345.34 |
| 2008/0094937 A1* | 4/2008 | Li et al. | 366/177.1 |
| 2008/0166884 A1* | 7/2008 | Nelson et al. | 438/765 |
| 2008/0193644 A1* | 8/2008 | Frob et al. | 427/255.6 |
| 2009/0226614 A1* | 9/2009 | Nasman | 427/255.28 |
| 2009/0311869 A1* | 12/2009 | Okesaku et al. | 438/710 |
| 2010/0292757 A1* | 11/2010 | Ehlbeck et al. | 118/723 E |

FOREIGN PATENT DOCUMENTS

| | | | | |
|---|---|---|---|---|
| DE | 10322696 B3 * | 1/2005 | | |
| EP | 1 264 330 B1 | 7/2003 | | |
| WO | WO-01/69644 | 9/2001 | | |
| WO | WO-2004/032176 | 4/2004 | | |
| WO | WO 2007145229 A1 * | 12/2007 | | C23C 16/455 |
| WO | WO 2009019156 A2 * | 2/2009 | | |

OTHER PUBLICATIONS

N Lucas et al., "Design and optimization of dielectric barrier discharge microplasma stamps," J. Phys. D: Appl. Phys. 41 (2008) 194012 (5pp).*

N Lucas et al., "Microplasma stamps for selective surface modification: design and characterization," J. Phys. D: Appl. Phys. 41 (2008) 215202 (7pp).*

N Lucas et al., "An improved method for double-sided moulding of PDMS," J. Micromech. Microeng. 18 (2008) 075037 (5pp).*

C. Penache et al., 26th, ICPIG 2003, International Conference on Phenomena in Ionized Gases, Proceedings, Greifswald, Germany, Jul. 15-20, 2003 pp. 237-238 (Penache'ICPIG).*

Klages, C. P., et al., "Surface Technology with Cold Microplasmas", Plasma Processes and Polymers, 4(3), Special Issue: Highlights from the Tenth International Conference on Plasma Surface Engineering PSE2006 in Garmisch-Partenkirchen, Germany, (Apr. 23, 2007), 208-218.

Kreitz, S., et al., "Patterned DBD treatment for area-selective metallization of polymers-plasma printing", Surface and Coatings Technology, 200(1-4), (Oct. 1, 2005), 676-679.

Penache, C., et al., "Plasma printing: patterned surface functionalisation and coating at atmospheric pressure", IEE Proc Nanobiotechnol., 151(4), (Aug. 2004), 139-44.

"International Application No. PCT/EP2009/003615, English Translation of International Preliminary Report on Patentability issued Dec. 6, 2010", 7 pgs.

"German Application DE 10322696, filed May 20, 2003, English translation", Translated by FLS, Inc., (Mar. 2014), 24 pgs.

* cited by examiner

PLASMA STAMP, PLASMA TREATMENT DEVICE, METHOD FOR PLASMA TREATMENT AND METHOD FOR PRODUCING A PLASMA STAMP

PRIORITY CLAIM TO RELATED APPLICATIONS

This application is a national stage application under 35 U.S.C. §371 of PCT/EP2009/003615, filed May 20, 2009, and published as WO 2009/141143 A1 on Nov. 26, 2009, which claims priority to German Application No. 10 2008 024 486.4, filed May 21, 2008, which applications and publication are incorporated herein by reference and made a part hereof in their entirety, and the benefit of priority of each of which is claimed herein.

The present subject matter relates to a plasma stamp, with which surfaces can be subjected to a plasma treatment. In addition, the present subject matter relates to a plasma treatment device, with which surfaces can be subjected to a plasma treatment, and also a plasma treatment method. In addition, the present subject matter relates to a method for producing a plasma stamp.

It is desired for many applications to be able to subject a surface to a locally-resolved or locally-selective plasma treatment. Specific regions of the surface are hereby intended to be subjected to a plasma, whilst other regions of the surface are not subjected to the plasma.

Such a locally-selective plasma treatment can be implemented with plasma stamps which have a surface with one or more, preferably a large number of cavities. A plasma can be produced in these cavities.

For locally-selective plasma treatment of a surface, the plasma stamp is placed or pressed with that surface having the cavities onto the surface to be treated. The surface to be treated is only subjected to the plasma where it abuts against one of the cavities when the plasma stamp is placed on. Due to the arrangement or activation of the cavities in the plasma stamp, it can be determined which regions of the surface to be treated are subjected to a plasma and hence to a plasma treatment.

A device for implementing such a plasma treatment method is described for example in EP 1 264 330 B1. Volumes which are closed in a plasma stamp and in which the plasma is ignited are disposed here. However, it is disadvantageous with such an arrangement that no gas can be supplied to or discharged from the cavities and that no pressure equalisation in the cavities is possible. This is relevant in particular when the plasma treatment is a coating method in which a coating is intended to be applied on the surface to be treated. The plasma gas in fact is consumed in this case. The thickness of the producible layer is therefore limited by the gas volume present in the cavities. Coatings of greater thickness are therefore not producible with such a device.

The present subject matter can be useful to indicate a plasma stamp and a plasma treatment device, in which the layer thickness which can be generated in a plasma coating method is not limited by the volume of the cavities and also other methods can be implemented independently of plasma gas being consumed. In addition, the present subject matter can be useful to indicate a method for the plasma treatment with which these advantages can be achieved. The present subject matter can be useful to indicate a method for producing a corresponding plasma stamp.

Such advantages can be achieved by the plasma stamp, the plasma treatment device, the method for the plasma treatment and the method for producing a plasma stamp according to the embodiments of the invention.

A plasma stamp according to an embodiment of the invention has a gas-conducting layer which has or consists of at least one porous material. The plasma stamp according to an embodiment of the invention has in addition at least one cavity which is in gas-permeable communication with the gas-conducting layer and has an opening towards an underside of the plasma stamp. According to an embodiment of the invention, the plasma stamp is now designed such that gas in the region behind the opening of the cavity can be conducted through the gas-conducting layer in the direction essentially parallel to the surface of the opening. The region behind the opening is that region in the interior of the plasma stamp in front of which the opening of the cavity is disposed in the underside. This region can include the cavity itself and also regions situated behind the cavity, viewed from the underside of the plasma stamp, in the interior of the plasma stamp. The region behind the opening of the cavity is therefore preferably at least a partial region of that region which is enclosed by a boundary surface, the one edge of which is the edge of the opening of the cavity in the underside. Preferably, this boundary surface is perpendicular to the underside of the plasma stamp. If the plasma stamp has a plurality of layers, then the region behind the opening can include only that layer in which the cavity is disposed, it can also include merely that layer which is situated adjacent to that layer in which the cavity is disposed or it can include both or all layers.

Preferably, gas can therefore be conducted past the opening of the cavity in the interior of the plasma stamp. The gas is hereby conducted, essentially or precisely parallel to the surface of the opening, past the latter. The gas can hereby flow directly through the cavity through the side walls thereof, but it is also possible that the gas flows past each end-side of the cavity situated opposite the opening of the cavity.

It is possible due to the arrangement according to the invention to supply gas to the cavity so that consumed gas can be refilled into the cavity and/or so that gas can be exchanged in the cavity. Preferably, the gas can be supplied to the cavity via the gas-conducting layer and can also be discharged from the cavity via the gas-conducting layer.

The cavity can be disposed in the gas-conducting layer itself. In this case, it is possible that the gas-conducting layer is penetrated by the cavity up to a specific depth perpendicular to the underside of the plasma stamp. Preferably, the gas-conducting layer is likewise disposed behind the cavity and is not penetrated there by cavities.

The cavity can also be disposed in a separate cavity layer, preferably the cavity having an opening on the upper side of the cavity layer and having an opening situated opposite the latter on the underside of the cavity layer. The cavity therefore preferably penetrates the cavity layer. Preferably, the underside of the cavity layer, in this arrangement, is identical to the underside of the plasma stamp so that the opening on the underside of the cavity layer is the above-mentioned opening towards the underside of the plasma stamp.

The gas-conducting layer in this arrangement is preferably disposed abutting against the cavity layer such that the gas-conducting layer abuts against the opening of the cavity on the upper side of the cavity layer and/or the gas can be conducted past the opening through the gas-conducting layer in the direction essentially parallel to the surface of the opening of the cavity on the upper side of the cavity layer. In this way, gas can be introduced into the cavity mainly by diffusion in the direction perpendicular to the underside of the plasma stamp. In the direction parallel to the underside of the plasma or to the surface in which the gas-conducting or the convection layer extend in a planar manner, the gas transport can be effected preferably mainly by convection.

Particularly advantageously, the gas flow can be adjusted in such a plasma stamp if the gas-conducting layer is disposed parallel to the cavity layer.

Preferably, the plasma stamp has an essentially gas-impermeable layer, which can be disposed on that side of the gas-conducting layer orientated away from the underside of the plasma stamp, on side walls of the gas-conducting layer or of the plasma stamp or even on the underside of the plasma stamp. By means of such a gas-impermeable layer, the gas can be conducted particularly conveniently in the gas-conducting layer in the direction parallel to the underside of the plasma stamp. By means of such a layer, gas can be prevented from escaping out of the gas-conducting layer via that upper side of the gas-conducting layer orientated away from the underside of the plasma stamp or via other surfaces of the plasma stamp. Advantageously, the gas-impermeable layer can also cover the other sides of the plasma stamp which are not the underside. In particular, it is advantageous in addition if the gas-impermeable layer has at least one opening for gas supply and/or at least one opening for gas discharge. Such openings can be disposed in one or more of the side walls between the upper side and the underside of the plasma stamp, however they can also both be disposed particularly advantageously in that upper side of the plasma stamp orientated away from the underside.

The plasma stamp preferably has an electrode with which, together with an electrode of a plasma treatment device, an electrical field can be produced. Such an electrode can be disposed on that side of the gas-conducting layer orientated away from the underside of the plasma stamp. This can also be the surface of the plasma stamp. The electrode preferably has a planar configuration and can cover the corresponding surface partially or completely.

The electrode can also be disposed on that side of the gas-impermeable layer orientated away from the gas-conducting layer or the plasma stamp. In turn, the electrode can extend in a planar manner and can cover the corresponding surface completely or partially.

Furthermore, it is also possible that the gas-impermeable layer itself is an electrode or operates as electrode. For this purpose, the gas-impermeable layer is preferably produced from an electrically conductive material, for example a metal. Furthermore, also the gas-conducting layer itself can be an electrode or can operate as electrode, for which purpose the latter is produced preferably from a conductive material.

All hollow shapes are basically possible for the cavity. Particularly advantageous are cylindrical shapes with a circular, rectangular, square, triangular or polygonal cross-section or base area. The term cylinder is used here in its general geometric meaning and describes a volume which is delimited by two surfaces which are preferably parallel and/or flat (the basic and the cover surface) and also by an outer peripheral or cylinder surface, the outer peripheral or cylinder surface extending along the edges of the basic and cover surface between the basic and the cover surface. The outer peripheral or cylinder surface is hereby formed preferably by parallel straight lines.

The diameter, the height and/or the depth of the cavities is preferably $\geq 30$ µm, particularly preferred $\geq 50$ µm, particularly preferred $\geq 70$ µm and/or $\leq 500$ µm, particularly preferred $\leq 300$ µm, particularly preferred $\leq 110$ µm, particularly preferred $\leq 100$ µm, particularly preferred $\leq 90$ µm, particularly preferred $\leq 80$ µm.

The cavities can be produced for example by microelectro-discharge-machining (µEDM) or by cutting by means of a laser. The various layers of the plasma stamp can be connected to each other for example by gluing or by means of adhesive-free methods.

The mentioned cavity layer can be produced from a large number of materials. In particular, dielectrics, such as ceramics, polymers, photoresist materials, photosensitive resists and/or metals, are advantageous. The cavity layer can be laminated for example onto an adjacent layer.

The porous material of the gas-conducting layer can advantageously be a porous metallic material and also sintered metal fibres or sintered powder, in particular sintered metal powder. Also metallic meshes or a plurality of layers of metallic meshes can be used. Metallic materials are in particular advantageous when the gas-conducting layer serves as electrode. There are possible as metals, for example stainless steels, nickel, copper, aluminium and chromium-nickel alloys.

The thickness of the cavity layer is preferably greater than or equal to 0.02 mm, particularly preferred greater than or equal to 0.05 mm, particularly preferred greater than or equal to 1 mm. The thickness of the cavity layer is in addition preferably $\leq 2$ mm, particularly preferred 1.5 mm.

The gas-conducting layer preferably has a thickness of $\geq 0.2$ mm, particularly preferred $\geq 0.5$ mm, particularly preferred $\geq 1$ mm. The thickness of the gas-conducting layer is in addition preferably $\leq 4$ mm, particularly preferred $\leq 3$ mm, particularly preferred $\leq 2$ mm. There is understood here by the thickness of the cavity layer or the gas-conducting layer, the extension of the corresponding layer in the direction perpendicular to the underside and hence also perpendicular to the planar extension of the corresponding layer.

The plasma treatment can be implemented particularly advantageously if a pressure can be produced in the cavity or cavities of $\geq 0.001$ bar, preferably $\geq 0.01$ bar, preferably $\geq 0.1$ bar, preferably $\geq 0.5$ bar. The corresponding pressure is in addition preferably $\leq 10$ bar, particularly preferred $\leq 5$ bar, particularly preferred $\leq 1.5$ bar.

A plasma can be produced in the cavities. Preferably a high-frequency discharge with a frequency of for example 13.56 MHz or however also a medium frequency discharge at a frequency preferably greater than or equal to 5 kHz, particularly preferred greater than or equal to 20 kHz, particularly preferred greater than or equal to 40 kHz and/or less than or equal to 100 kHz, preferably less than or equal to 80 kHz, particularly preferred less than or equal to 60 kHz, is produced. In the case of medium frequency discharges, also transient gas discharges are mentioned because they are extinguished again and reignited in each half-wave.

According to the application, the plasma can be produced or can be producible preferably such that the gas discharge contains very active particles, such as for example high-energy electrons, ions, photons, atoms, radicals etc. which make it possible, even at relatively low temperatures, also to modify comparatively inert materials. Within the scope of the present invention, modified materials can be for example electrical insulators, polymers, glass, ceramics or metals. A modification can consist in a chemical and/or physical change but it can also be a removal of material from the surface or a coating of the surface with material. An embodiment of the present invention is particularly advantageous for coating with material. Polymer surfaces can for example be preoxidised and hence be made wettable, polymers being removed by oxidation or by ion bombardment. Metals can be oxidized or sputtered. A modification can also be a change in the chemical structure of the surface, thus for example application of specific functional groups in the case of polymers, such as e.g. polytetrafluoroethylene (PTFE). The modification can also consist in a layer deposition in which a change in the physical dimensions of the surface, such as for example the surface conductivity or the surface tension, is effected. An embodiment of the invention can also be used in the sphere of plasma printing.

According to an embodiment of the invention, noble gases, oxygen, nitrogen (also in a mixture with hydrogen), air and/or ammonia can be used inter alia as gas, in particular for the surface modification. Fluorine-containing gases inter alia can also be used for etching or removing surfaces. There can be used for a coating, for example hydrocarbons, fluorohydrocarbons, silanes, organosilanes, silicic acid esters, hexamethyldisilane (HMDS), hexamethyldisiloxane (HMSO), hexamethyldisilazane (HMDSN), tetramethylsilane (TMS) and also volatile unsaturated radically polymerisable compounds, such as e.g. acrylates, methacrylates, maleic acid anhydride and/or vinyl compounds.

An embodiment of the present invention can also be used for combinatorial research in the field of plasma-based surface technology or surface chemistry. For this purpose, the plasma stamp can have at least two cavities which are disposed preferably in an array. In the plasma stamp, at least one property of the plasma treatment can now be changed between the various cavities. This can be for example a property of the gas flowing through the gas-conducting layer, of a plasma in the cavities and/or a property of the plasma stamp itself. The plurality of cavities is preferably disposed in one plane and the mentioned properties can be changed preferably in one or two, preferably mutually perpendicular, directions in this plane. The plane in which a plurality of cavities is disposed is preferably the plane of the underside of the plasma stamp. Properties which can hereby be changed are for example a gas phase concentration, a temperature of the gas, a temperature of the plasma, a temperature of the cavity layer and/or of the gas-conducting layer an electrical field strength, an operating cycle portion, a treatment duration or even a burning duration of the plasma. The corresponding property can be adjusted specifically as a function of the location. However it can also be made use of that the property can be variably adjusted on the basis of the arrangement of the plasma stamp, its construction or on the basis of changes due to the plasma treatment itself at different locations. A concentration gradient can be set for example by gas being conducted through the gas-conducting layer via a large number of cavities. If now gas is consumed in each of the cavities, then a concentration gradient is produced in the direction of the gas flow via the cavities. A property can also be changed in one direction and another property in another direction, preferably perpendicular hereto. Electrodes which can be operated in lines can also be used so that electrical values for various cavities can be adjusted variably. This can be for example an electrical field strength. With such an arrangement, regions which were plasma-treated with different properties can be produced on the surface to be treated.

Such an arrangement enables the production of combinatorial methods which reduce the experimental complexity which is often required to determine optimal conditions for plasma-based surface technologies. One example is the optimisation of the gas composition and the treatment parameters in order to achieve maximum adhesion of a coating on a substrate. Many other possibilities are conceivable, such as for example surface tension gradients or gradients in the density of functional groups. In conjunction with locally-resolved surface characterisation methods, examination of plasma-surface interactions can be significantly facilitated.

The plasma stamp can be cleaned for example in a plasma-chemical process after a number of uses. It is preferred for this purpose if the plasma stamp is produced from metal.

The described plasma stamp can be used in a plasma treatment device. Such a plasma treatment device then has at least one electrode which is disposed below the underside of the plasma stamp such that a substrate to be treated or a surface to be treated can be disposed between this electrode and the underside of the plasma stamp. The substrate to be treated is therefore disposed on the electrode and then thereabove the plasma stamp. Preferably, a carrier substrate is disposed between the electrode and the underside of the plasma stamp such that the substrate to be coated can be disposed between the carrier substrate and the underside of the plasma stamp. The carrier substrate is then thus disposed above the electrode. Advantageously, the carrier substrate has or consists of glass, it being particularly preferred that the carrier substrate is a glass layer coated with an ITO (indium-tin oxide) layer on that side orientated away from the underside of the plasma stamp. This ITO layer can serve as electrode.

With the plasma stamp according to an embodiment of the invention and the plasma treatment device according to an embodiment of the invention, a method for plasma treatment of surfaces can also be implemented, gas being supplied to a cavity in a plasma stamp, which has an opening towards an underside of the plasma stamp, via a gas-conducting layer which has or consists of at least one porous material, by means of a gas flow essentially parallel to the opening of the cavity.

Examples of the invention are intended to be explained subsequently by way of example with reference to some FIGS. The features shown in the FIGS. can be produced also individually according to the invention.

There are shown

Figure 2:
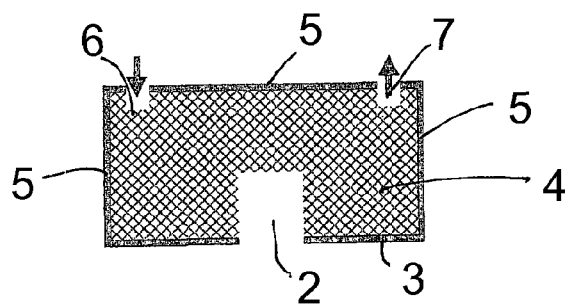
Figures 3, 4:
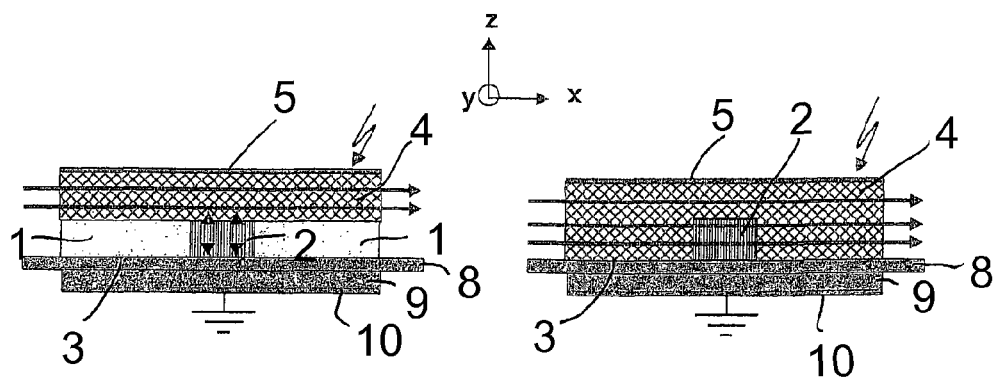

FIG. 1 a first embodiment of a plasma stamp according to an embodiment of the invention, FIG. 2 a second embodiment of a plasma stamp according to an embodiment of the invention, FIG. 3 a plasma coating device according to an embodiment of the present invention and FIG. 4 a further plasma coating device according to an embodiment of to the invention.

FIG. 1 shows a plasma stamp according to an embodiment of the invention. The plasma stamp has a cavity layer 1 in which a cylindrical cavity 2 is introduced. The cavity 2 has an opening in an underside 3 of the plasma stamp. A gas-conducting layer 4 which has a porous material is disposed on that side of the cavity layer 1 orientated away from the underside 3 of the plasma stamp. The gas-conducting layer 4 is covered on its upper side orientated away from the cavity layer 1 and also on its side surfaces perpendicular hereto with a gas-impermeable layer 5. In the gas-impermeable layer 5, an opening 6 for gas inflow and through the opening 7 for gas outflow is introduced on the upper side of the gas-conducting layer 4. In this plasma stamp, gas can therefore be introduced through the opening 6 through the gas-impermeable layer 5 into the gas-conducting layer 4 and be conducted out of the gas-conducting layer 4 through the opening 7. In the gas-conducting layer 4, the gas flows past the cavity 2 in the region behind the cavity 2 essentially parallel to the surface of the opening of the cavity in the underside of the plasma stamp. Gas hereby passes out of the gas-conducting layer 4 into the cavity 2 mainly by diffusion. The illustrated plasma stamp can be disposed with its underside 3 on a substrate to be treated.

The cavity layer 1 can be a dielectric layer. This permits the production of a very homogeneous electrical field in the cavity, which promotes a more uniform distribution of the discharge. Alternatively, also a laminated photoresist layer can be used as cavity layer. The illustrated cavity layer 1 can be for example also a metal foil of approx. 100 µm thickness which carries the corresponding cavity pattern. The cavities can be produced for example by microelectro-discharge-machining (µEDM) or by laser cutting. The foil can be bonded to the porous material of the gas-conducting layer for example just by simple gluing or by adhesive-free processes. The cavity shown in FIG. 1 has for example a diameter 50 to 100 µm and a similar height. A purely metallic design has the advantage that it is significantly more stable relative to plasma at atmospheric pressure than a polymer.

FIG. 2 shows a further example of a plasma stamp according to an embodiment of the invention. A cavity 2 is introduced here into the gas-conducting layer 4. The cavity 2 is not introduced to the entire depth of the gas-conducting layer 4, but only up to a specific depth. In turn, the gas-conducting layer 4 is coated by an impermeable layer 5 on the side faces thereof and also on the surface and also on the underside 3.

On the upper side of the gas-conducting layer 4 which is orientated away from the underside 3, an opening 6 for gas inflow and also an opening 7 for gas outflow is introduced. Gas can therefore be introduced through the opening 6 into the gas-conducting layer 4 and into the plasma stamp and can be discharged from the opening 7. In the gas-conducting layer 4, the gas flows past the cavity 4 in the region behind the opening of the cavity 2, on the one hand, as described above, but, on the other hand, also directly through the cavity 4. Gas is introduced here therefore also by convection into the cavity 4.

FIG. 3 now shows a plasma coating device according to an embodiment of the present invention. In the illustrated plasma coating device, a plasma stamp with a gas-impermeable layer 5, a gas-conducting layer 4 and a cavity layer 1 is disposed on a substrate 8 to be coated which, for its part, is disposed on a glass plate 9 which is coated on its side orientated away from the substrate 8 to be coated with a conductive layer 10 made of indium-tin oxide (ITO). The conductive indium-tin oxide layer 10 serves here as electrode. In the illustrated example, only the upper side of the plasma stamp orientated away from the underside 3 of the plasma stamp is coated with a gas-impermeable layer 5. This gas-impermeable layer 5 hereby serves in addition as electrode 5. The gas-impermeable layer 5, the gas-conducting layer 4, the cavity layer 1, the substrate to be coated, the carrier substrate 9 and also the electrode 10 are disposed parallel to each other in the illustrated example. Gas can be conducted now parallel to the electrode 5 through the gas-conducting layer 4. Gas then passes into the cavity 2 mainly by diffusion. By applying an electrical voltage between the electrodes 5 and 10, a plasma, with which the surface 8 can be treated, can be produced in the cavity 2.

FIG. 4 shows a further embodiment of a plasma coating device according to an embodiment of the invention. The same reference numbers hereby correspond to corresponding features as in the other FIGS. The embodiment shown in FIG. 4 has no cavity layer 1. Rather, the cavity 2 is introduced into the gas-conducting layer 4. In turn, a gas-impermeable layer 5 which serves as planar electrode in the illustrated example is disposed also on that upper side of the gas-conducting layer 4 orientated away from the underside 3. Gas can now be conducted from the side walls of the gas-conducting layer 4 through these and flows, on the one hand, through the cavity 2 but also flows above the cavity 2 past the latter. Gas transport into the cavity takes place here mainly by convection. In turn, the plasma is produced in the cavity 2 by applying a voltage between the electrodes 5 and 10.

A plasma coating device according to an embodiment of the invention can be produced for example as follows. A porous sintered metal plate, produced from metal fibres of on average 50 µm diameter, of 1 mm thickness and an area of 50×50 mm$^2$ as gas-conducting layer is glued from one side (upper side) onto a 125 µm thick stainless steel foil as gas-impermeable layer and, from the other side (underside) to a likewise 125 µm thick stainless steel foil as cavity layer. Cylindrical borings are introduced into the stainless steel foil applied on the underside as cavities of 500 µm diameter. For example 100 borings are introduced on a square grid with centre spacings of 2 mm. The edges are sealed with an adhesive. Subsequently, two parallel slots which are 40 mm long and 1 mm wide are milled into the upper side in the immediate vicinity of the edges of the upper side, which here is a square plate, as gas supply or discharge so that the plate can be subjected to a flow of gas over a length of approx. 45 mm.

A coating of a substrate can be implemented then for example as follows. A gas mixture consisting of 1% tetramethylorthosilicate in a mixture of 19% oxygen and 80% helium is conducted at a prepressure of 0.1 bar through the arrangement. The cavity layer is pressed by its underside onto a 75 µm thick polyethylene film. An ITO-coated glass sheet is disposed below the polyethylene film as counter-electrode. A high voltage of approx. 30 kHz is applied to the electrodes. The voltage is then increased until ignition of a discharge at approx. 6.5 kV (amplitude).

After an effective time of the discharge of 10 s, a polymer surface is examined by means of ATR-IR spectroscopy and profilometrically. $SiO_2$ is recognised by means of its strong IR absorption at 1,060 cm$^{-1}$. The layer thickness of the circular deposits is on average 30 nm.

What is claimed is:

1. A plasma stamp, comprising:
   a gas-conducting layer including or consisting of at least one porous material; and
   at least one cavity which is in gas-permeable communication with the gas-conducting layer and includes an opening towards an underside of the plasma stamp, gas in the region behind the opening of the cavity being able to be conducted through the gas-conducting layer in a direction essentially parallel to the surface of the opening,
   wherein the cavity is disposed in a cavity layer, the cavity extending up to an upper side of the cavity layer and also up to an underside of the cavity layer situated opposite the upper side,
   wherein the gas-conducting layer abuts against the cavity on the upper side of the cavity layer, and
   comprising a gas-impermeable layer on a side of the gas-conducting layer that is orientated away from the underside of the plasma stamp,
   wherein the gas-impermeable layer includes a gas supply port and a gas discharge port that are together arranged such that the gas in the region behind the opening of the cavity is able to be conducted between the gas supply port and the gas discharge port through the gas conducting layer in a direction essentially parallel to the surface of the opening.

2. The plasma stamp according to claim 1, wherein the gas is capable of being supplied to the cavity and/or can be discharged out of the cavity via the gas-conducting layer.

3. The plasma stamp according to claim 1, wherein the cavity is disposed in the gas-conducting layer.

4. The plasma stamp according to claim 1, wherein the gas is capable of being conducted past the cavity through the gas-conducting layer in the direction parallel to the surface of the upper side of the cavity layer.

5. The plasma stamp according to claim 1, wherein the gas-conducting layer is disposed parallel to the cavity layer on the cavity layer.

6. The plasma stamp according to claim 1, comprising a gas impermeable layer on at least one surface of the plasma stamp between an upper side of the plasma stamp and the underside of the plasma stamp and/or on the underside of the plasma stamp.

7. The plasma stamp according to claim 1, wherein an electrode is disposed on an upper side of the plasma stamp orientated away from the underside or on a side of the gas-conducting layer that is orientated away from the underside of the plasma stamp and/or in that an electrode is disposed on a side of a gas-impermeable layer that is orientated away from the gas-conducting layer and/or in that a gas-impermeable layer is an electrode or in that the gas-conducting layer is an electrode.

8. The plasma stamp according to claim 1, wherein the cavity is cylindrical with a circular, rectangular, square, triangular or polygonal cross-section or base area.

9. The plasma stamp according to claim 1, wherein the cavity layer includes or consists of at least one material selected from the group consisting of a dielectric, ceramic, polymer, a photoresist material and metal.

10. The plasma stamp according to claim 1, wherein the porous material includes or consists of one or a combination of a porous metallic material, sintered metal fibres, sintered powder, sintered metal powder, one or more layers of metallic meshes, wherein the open pore volume is ≥30%, wherein the metal includes or consists of one or a combination of stainless steel, nickel, copper, aluminium, and Cr-nickel alloys.

11. The plasma stamp according to claim 1, wherein the thickness of the cavity layer is ≥0.02 mm, and the thickness of the cavity layer is ≤2 mm, and/or the thickness of the gas-conducting layer is ≥0.2 mm, and the thickness of the gas-conducting layer is ≤4 mm.

12. The plasma stamp according to claim 1, wherein a pressure of ≥0.001 bar and ≤10 bar is capable of being produced in the cavity.

13. The plasma stamp according to claim 1, wherein a plasma is capable of being produced in the cavity.

14. The plasma stamp according to claim 1, comprising at least two cavities which are disposed in an array, at least one property of the gas flowing through the gas-conducting layer, of a plasma in the cavities and/or at least one property of the plasma stamp being changeable and/or adjustable in one or two directions parallel to the underside of the plasma stamp.

15. The plasma stamp according to claim 14, wherein the property is at least one property selected from the group having a gas phase concentration, a temperature of the gas, a temperature of the plasma, a temperature of the cavity layer, a temperature of the gas-conducting layer, an electrical field strength, an operating cycle portion, a treatment duration and a burning duration of the plasma.

16. The plasma stamp according to claim 1, wherein at least one of a plasma coating, a removal, a surface cleaning and/or a surface modification, a surface modification with air, oxygen and/or nitrogen-containing gases, is capable of being effected with the plasma stamp.

17. The plasma treatment device having at least one plasma stamp according to claim 1 and also having at least one electrode which is disposed below the underside of the plasma stamp such that a substrate to be treated is capable of being disposed between the electrode and the underside of the plasma stamp.

18. The plasma treatment device according to claim 17, comprising at least one carrier substrate between the electrode below the underside and the underside of the plasma stamp, which is disposed such that the substrate to be treated is capable of being disposed between the carrier substrate and the underside of the plasma stamp.

19. The plasma treatment device according to claim 17, wherein the carrier substrate includes or consists of glass.

* * * * *